(12) United States Patent
Lin et al.

(10) Patent No.: US 6,365,483 B1
(45) Date of Patent: Apr. 2, 2002

(54) METHOD FOR FORMING A THIN FILM RESISTOR

(75) Inventors: Horng-bin Lin; Hsien-chang Kuo, both of Hsin Chu (TW)

(73) Assignee: Viking Technology Corporation, Hsin Chu (TW)

(*) Notice: Subject to any disclaimer, the term of this patent is extended or adjusted under 35 U.S.C. 154(b) by 0 days.

(21) Appl. No.: 09/668,773

(22) Filed: Sep. 22, 2000

(30) Foreign Application Priority Data

Apr. 11, 2000 (TW) .......................................... 89106687

(51) Int. Cl.[7] .............................................. H01L 21/20
(52) U.S. Cl. ...................... 438/384; 438/381; 438/382; 438/385
(58) Field of Search ................................ 438/381, 382, 438/384, 385

(56) References Cited

U.S. PATENT DOCUMENTS 5,485,138 A * 1/1996 Morris ........................ 338/306
5,976,392 A * 11/1999 Chen ............................ 216/16
5,976,944 A * 11/1999 Czagas et al. ............... 438/382
6,165,862 A * 12/2000 Ishikawa et al. ............ 438/384

FOREIGN PATENT DOCUMENTS

GB    2320137    *   6/1998

* cited by examiner

Primary Examiner—Trung Dang
(74) Attorney, Agent, or Firm—Martine & Penilla, LLP

(57) ABSTRACT

The invention provides a method for forming a thin film resistor, which comprises the following steps: providing an insulator substrate; forming a patterned conductive layer over the insulator substrate by a non-photolithographic method; forming a thin film resistive layer on the patterned conductive layer and the insulator substrate; patterning the thin film resistive layer by photolithography. Using the method for forming a thin film resistor in accordance with the invention, the fabrication costs of the thin film resistor can be lowered.

13 Claims, 3 Drawing Sheets

METHOD FOR FORMING A THIN FILM RESISTOR

BACKGROUND OF THE INVENTION

1. Field of the Invention

The invention relates to a method for forming a thin film resistor.

2. Description of the Related Art

In the art of microelectronics fabrications, such as integrated circuit microelectronics fabrications and hybrid circuit microelectronics fabrications, thin film resistors are used as passive electrical circuit elements.

When thin film resistors are used in hybrid circuit microelectronics fabrications, a typical method for forming the resistors comprises the steps as follows: First, a layer of thin film resistive material and a layer of conductive material are formed, in this order, over an insulator substrate such as a glass insulator substrate or a ceramic insulator substrate. Next, the conductive material and then the resistive material are patterned by photolithography to form a patterned conductive layer and a patterned resistive layer. Next, the resistance of the patterned resistive layer is determined through laser trimming and the insulator substrate is then parted to form discrete thin film resistors.

The above-mentioned method of the prior art has the following disadvantages. Since the patterned conductive layer and the patterned resistive layer are formed by photolithography, and costs of photolithographic apparatus and materials are high, the fabrication costs of discrete thin film resistors are high. In the prior art method for forming the patterned conductive layer and the patterned resistive layer by photolithography, an insulator substrate of enhanced surface flatness and finish is typically required in a spin-coating process of a photoresist layer, in order to ensure the photoresist layer having an uniform thickness and provide an adequate registration of the insulator substrate within photolithographic apparatus. Generally, an aluminum oxide blank substrate with a purity of 99.6% is required, and it needs to be polished in order to enhance its surface flatness and finish. Compared with a conventional aluminum oxide substrate already provided with scribe lines, the aluminum oxide blank substrate cannot be cut simply along the scribe lines at a low cost but must be cut using laser, and thus further increases the fabrication costs of discrete thin film resistors.

SUMMARY OF THE INVENTION

Therefore, it is the object of the invention to provide a method for forming a thin film resistor solving all the above-mentioned problems.

The method for forming a thin film resistor in accordance with the invention comprises the following steps: providing an insulator substrate; forming a patterned conductive layer over the insulator substrate by a non-photolithographic method; forming a thin film resistive layer on the patterned conductive layer and the insulator substrate; applying photoresist by a known dry film process or a spray coating process in place of a spin coating process and then patterning the thin film resistive layer by photolithography. Since the dry film process and the spray coating process can be applied to an uneven surface of substrate, thin film resistors can be formed on a conventional aluminum oxide substrate already provided with scribe lines and can be separated by simply cutting along the scribe lines with low costs. Thus, the costs of raw materials and the manufacturing costs can be lowered. In this case, the insulator substrate can be a glass insulator substrate or a ceramic insulator substrate. A leveling layer can be formed on the insulator substrate before forming the patterned conductive layer over the insulator substrate.

The above-mentioned non-photolithographic method can be a screen printing method. The patterned conductive layer can be made from a material comprising silver, silver alloys, gold, gold alloys, copper, copper alloys, palladium, palladium alloys, nickel, or nickel alloys. In addition, the thin film resistive layer can be made from a material comprising tantalum nitride resistive materials, tantalum silicide resistive materials, tantalum-chromium alloy resistive materials, nickel-chromium alloy resistive materials, chromium silicide resistive materials, or higher order alloys of the aforementioned resistive materials. The thin film resistive layer can be formed by a method selected from the group consisting of thermally assisted evaporation methods, electron beam assisted evaporation methods, physical vapor deposition methods, chemical vapor deposition methods, or plasma enhanced chemical vapor deposition methods.

Laser trimming can adjust the resistance of the patterned thin film resistive layer. In addition, the resistance of the thin film resistive layer can be adjusted during the photolithographic patterning of the thin film resistive layer.

Using the method of the invention, since a non-photolithographic method is used in place of a conventional photolithographic method to form the thin film resistive layer, the fabrication costs of a thin film resistor is lowered. Furthermore, an aluminum oxide substrate with a purity of 99.6%, used in conventional method, is not required in the invention. Instead, an aluminum oxide substrate with a purity of 96% can be used, which greatly lowers the fabrication costs of the discrete thin film resistors.

The above and other objects, advantages, and features of the invention will become apparent from the following description with reference to the accompanying drawings.

DESCRIPTION OF THE PREFERRED EMBODIMENT

An embodiment in accordance with the invention will hereinafter be described with reference to the drawings.

Figure 1:
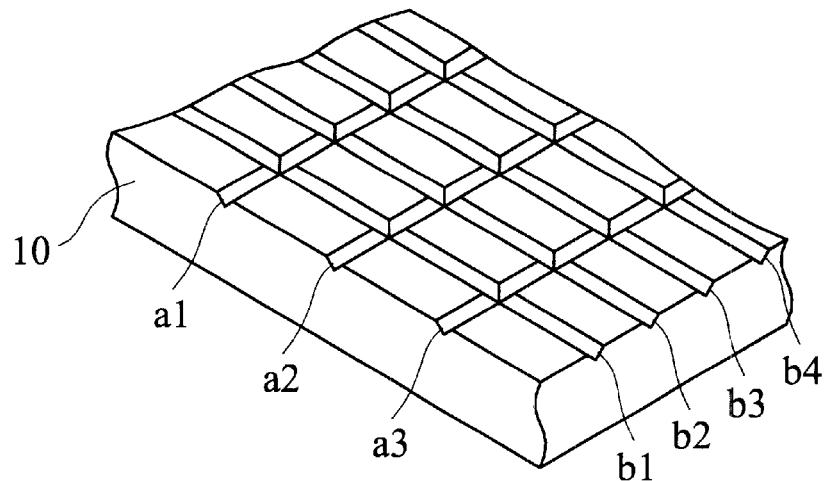
FIG. 1 is a schematic view showing a scribed insulator substrate used in the invention.

Referring to FIG. 1, an insulator substrate 10 used in the invention has scribe lines including lengthwise scribe lines b1, b2, b3, and b4, and horizontal scribe lines a1, a2, and a3. The scribe lines can be formed in the insulator substrate 10 through any known method such as physical scribing methods employing scribes or other cutting tools, or scribing methods employing laser beams. The insulator substrate 10 of the invention can be, for example, a glass insulator substrate, or a ceramic insulator substrate.

Figure 2:
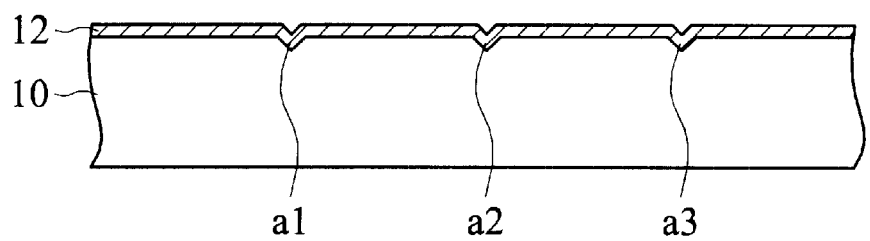
FIGS. 2 to 6 are cross-sectional views showing the successive steps of the method for forming a thin film resistor in accordance with the invention.

Next, a leveling layer 12 can be formed on the insulator substrate 10 as shown in FIG. 2, in order to roughly planarize the upper surface of the insulator substrate 10 and fill in pits on the surface of the substrate. The leveling layer 12 can be a silicon oxide layer or a silicon nitride layer formed by any one of the known thin film formation methods such as thermally assisted evaporation methods, electron beam assisted evaporation methods, physical vapor deposition methods, chemical vapor deposition methods, or plasma enhanced chemical vapor deposition methods. Alternatively, the leveling layer 12 can be a glaze layer formed by any one of the known thick film methods. The material used to form the glaze layer can include silicon oxide, aluminum oxide, and titanium oxide. It is to be noted that the step of forming the leveling layer 12 is not absolutely necessary, but a method for forming a thin film resistor with this step can produce a resistor with improved quality. Furthermore, a glazed substrate can be used as the insulator substrate 10 of the invention and then it is processed as follows.

Figure 3:
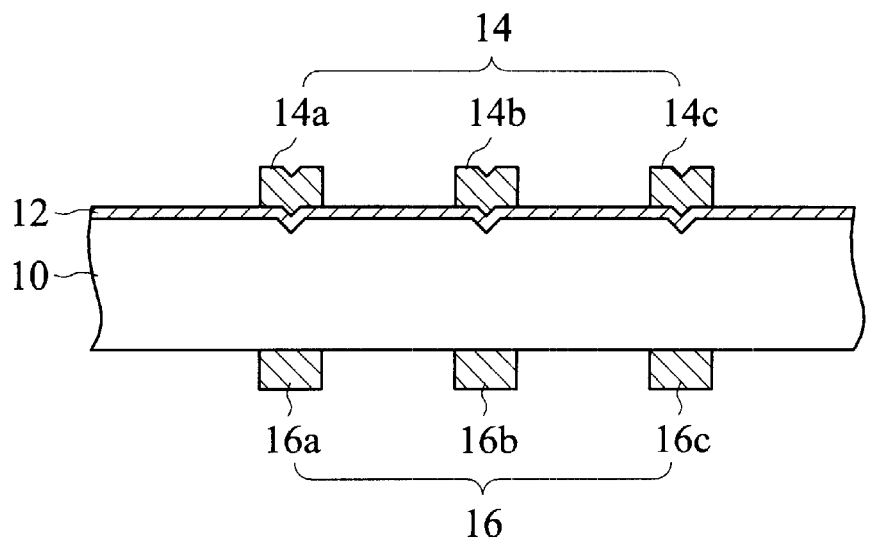

A patterned upper conductive layer 14 is formed on the leveling layer 12, as shown in FIG. 3, through a non-photolithographic method such as a screen printing method, and a corresponding patterned lower conductive layer 16 is formed on the lower surface of the insulator substrate 10. As shown in FIG. 3, the patterned upper conductive layer 14 includes discrete upper leads 14a, 14b, and 14c, and the patterned lower conductive layer 16 includes discrete lower leads 16a, 16b, and 16c. The patterned upper conductive layer 14 and the patterned lower conductive layer 16 of the invention can be made using materials that include silver, silver alloys, gold, gold alloys, copper, copper alloys, palladium, palladium alloys, nickel, or nickel alloys.

Figure 4:
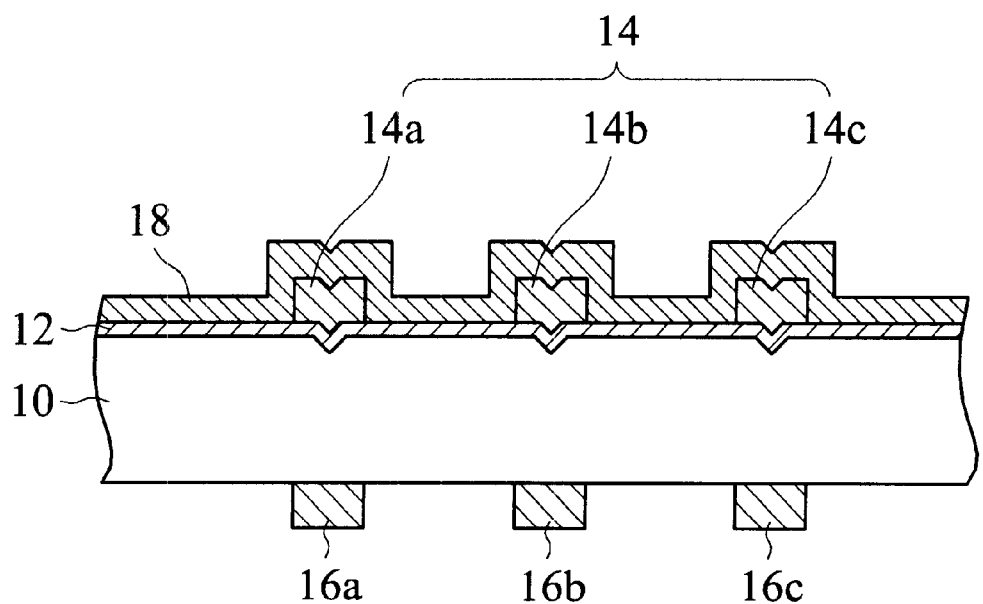

Subsequently, a thin film resistive layer 18 is formed on the patterned upper conductive layer 14 and the leveling layer 12 as shown in FIG. 4. The thin film resistive layer 18 of the invention can be made using a material comprising tantalum nitride resistive materials, tantalum silicide resistive materials, tantalum-chromium alloy resistive materials, nickel-chromium alloy resistive materials, chromium silicide resistive materials, or higher order alloys of the aforementioned resistive materials. In addition, the thin film resistive layer 18 can be formed using any one of the known thin film formation methods, such as thermally assisted evaporation methods, electron beam assisted evaporation methods, chemical vapor deposition methods, plasma enhanced chemical vapor deposition methods, or physical vapor deposition methods. In this case, it is preferred that the thin film resistive layer 18 has a thickness ranging from 100 to 1000 angstroms.

Figure 5:
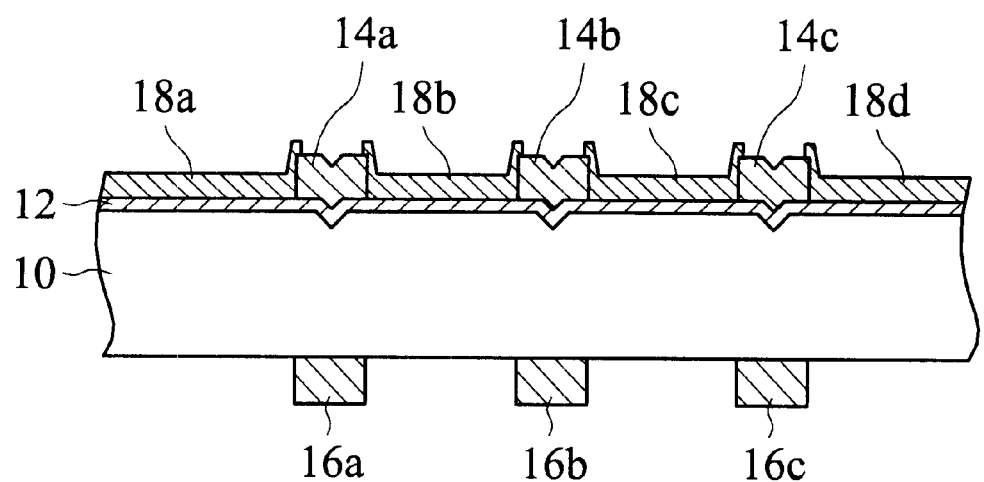
Figure 6:
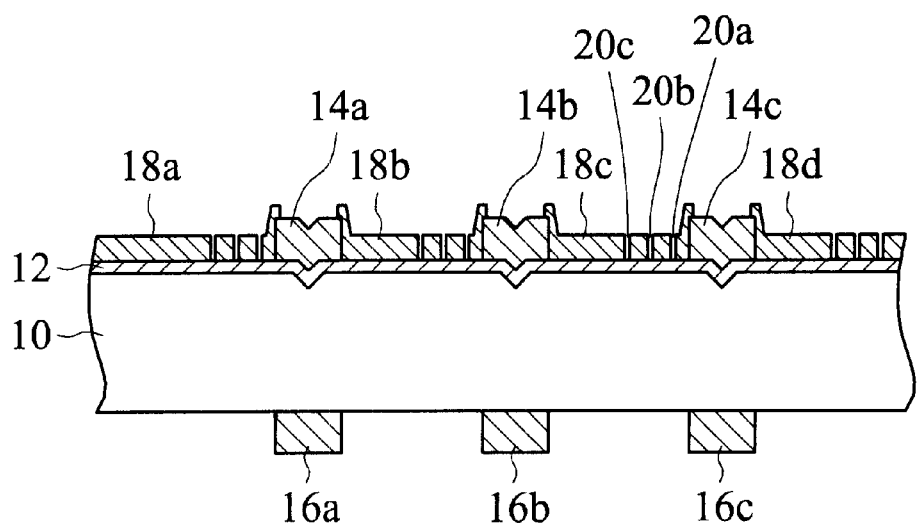
Figure 7:
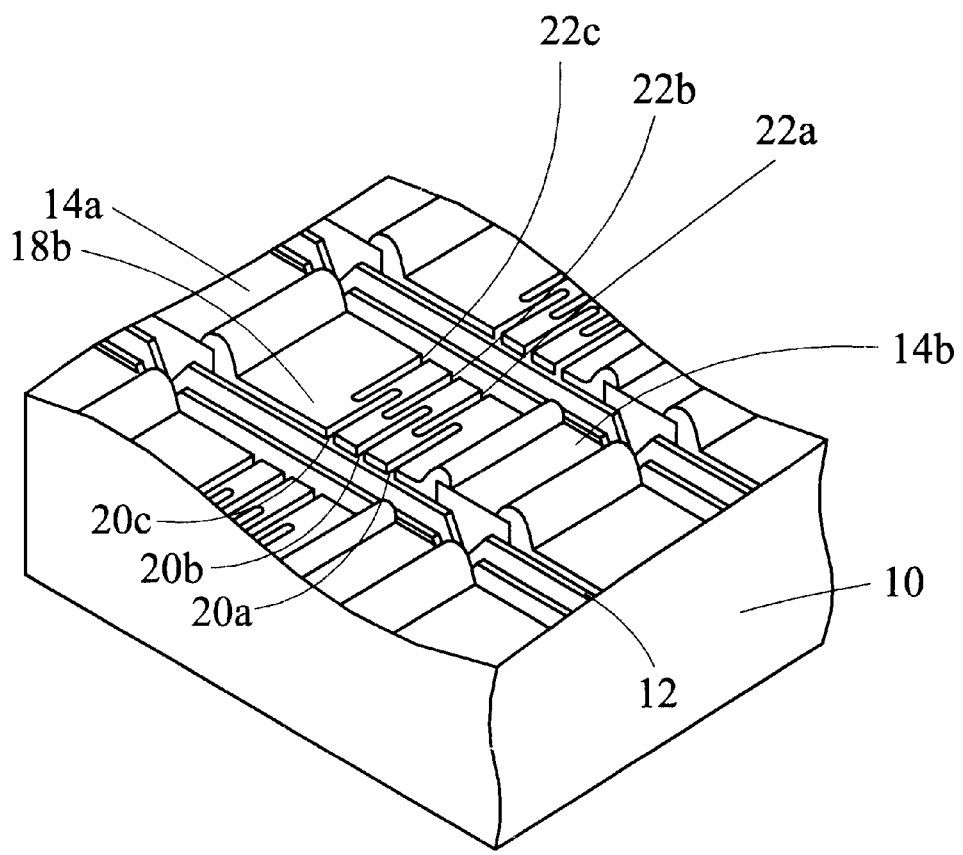
FIG. 7 is a schematic view showing a portion corresponding to the cross-sectional view of FIG. 6.

Next, photoresist is applied to the thin film resistive layer 18 by a dry film or a spray coating process and then the thin film resistive layer 18 is patterned by photolithography as shown in FIG. 5, so that patterned thin film resistors 18a, 18b, 18c, and 18d are formed. Then, the patterned thin film resistors 18a, 18b, 18c, and 18d are trimmed using laser trimming to form kerfs 20a, 20b, 20c, 22a, 22b, and 22c, in order to control the resistance of each thin film resistor as shown in the cross-sectional view FIG. 6 and its corresponding schematic view FIG. 7. Thereby, a thin film resistor with desired resistance can be formed.

Subsequently, a protecting layer (not shown) is formed over the patterned thin film resistors 18a, 18b, 18c, and 18d, so that the patterned thin film resistors 18a, 18b, 18c, and 18d are sealed. Any one of the known sealant materials used in the art of thin film resistor manufacturing can be used, for example epoxy sealants, urethane sealants, or silicone sealants. Finally, the insulator substrate 10 is cut along the scribe lines to form discrete thin film resistors.

While the present invention has been particularly described, in conjunction with specific preferred embodiments, it is evident that many alternatives, modifications and variations will be apparent to those skilled in the art in light of the previous description. It is therefore contemplated that the appended claims will embrace any such alternatives, modifications and variations as falling within the true scope and spirit of the present invention. For example, the kerfs 20a, 20b, 20c, 22a, 22b, and 22c can be formed using laser trimming of the patterned thin film resistors 18a, 18b, 18c, and 18d; in addition, the kerfs 20a, 20b, 20c, 22a, 22b, and 22c can be simultaneously formed by photolithography along with the patterned thin film resistors 18a, 18b, 18c, and 18d. Thus, at the same time when the thin film resistive layer 18 is patterned by photolithography, the resistance of the thin film resistive layer 18 is adjusted. This can be done by changing the mask pattern.

What is claimed is:

1. A method for forming a thin film resistor, comprising the steps of:
    providing an insulator substrate;
    forming a patterned conductive layer over said insulator substrate by a non-photolithographic method;
    forming a thin film resistive layer on said patterned conductive layer and said insulator substrate; and
    patterning said thin film resistive layer by photolithography.

2. The method as in claim 1, wherein said insulator substrate is selected from the group consisting of glass insulator substrates and ceramic insulator substrates.

3. The method as in claim 1, further comprising the step of:
    forming a leveling layer on said insulator substrate before forming said patterned conductive layer over said insulator substrate.

4. The method as in claim 3, wherein said leveling layer is formed by a method selected from a group consisting of thermally assisted evaporation methods, electron beam assisted evaporation methods, physical vapor deposition methods, chemical vapor deposition methods, and plasma enhanced chemical vapor deposition methods.

5. The method as in claim 3, wherein said leveling layer is formed by a thick film method.

6. The method as in claim 1, wherein said non-photolithographic method is a screen printing method.

7. The method as in claim 1, wherein said patterned conductive layer is made from a material selected from a group consisting of silver, silver alloys, gold, gold alloys, copper, copper alloys, palladium, palladium alloys, nickel, and nickel alloys.

8. The method as in claim 1, wherein said thin film resistive layer has a thickness ranging from 100 to 1000 angstroms.

9. The method as in claim 1, wherein said thin film resistive layer is made of a material selected from a group consisting of tantalum nitride resistive materials, tantalum silicide resistive materials, tantalum-chromium alloy resistive materials, nickel-chromium alloy resistive materials, chromium silicide resistive materials, and higher order alloys of the aforementioned resistive materials.

10. The method as in claim 1, wherein said thin film resistive layer is formed by a method selected from a group consisting of thermally assisted evaporation methods, electron beam assisted evaporation methods, physical vapor deposition methods, chemical vapor deposition methods, and plasma enhanced chemical vapor deposition methods.

11. The method as in claim 1, further comprising the step of:

laser trimming the patterned thin film resistive layer to determine its resistance.

12. The method as in claim 1, wherein at the same time said thin film resistive layer is patterned by photolithography, the resistance of said thin film resistive layer is adjusted.

13. The method as in claim 1, wherein in the step of patterning said thin film resistive layer by photolithography, photoresist is applied by a dry film process or a spray coating.

* * * * *